United States Patent
Fitzsimmons et al.

(10) Patent No.: US 7,109,093 B2
(45) Date of Patent: Sep. 19, 2006

(54) CRACKSTOP WITH RELEASE LAYER FOR CRACK CONTROL IN SEMICONDUCTORS

(75) Inventors: John A. Fitzsimmons, Poughkeepsie, NY (US); Michael W. Lane, Cortlandt Manor, NY (US); Vincent J. McGahay, Poughkeepsie, NY (US); Thomas M. Shaw, Peekskill, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 10/708,735

(22) Filed: Mar. 22, 2004

(65) Prior Publication Data

US 2005/0208781 A1   Sep. 22, 2005

(51) Int. Cl.
*H01L 21/76* (2006.01)
*H01L 21/82* (2006.01)

(52) U.S. Cl. ............... 438/427; 438/128; 438/129; 438/424

(58) Field of Classification Search ............... None
See application file for complete search history.

(56) References Cited

U.S. PATENT DOCUMENTS

| | | |
|---|---|---|
| 6,091,131 A | 7/2000 | Cook et al. |
| 6,174,814 B1 * | 1/2001 | Cook et al. ............... 438/692 |
| 6,261,945 B1 | 7/2001 | Nye, III et al. |
| 6,492,247 B1 | 12/2002 | Guthrie et al. |
| 2005/0026397 A1 * | 2/2005 | Daubenspeck et al. ...... 438/465 |
| 2005/0269702 A1 * | 12/2005 | Otsuka ............... 257/750 |

* cited by examiner

*Primary Examiner*—Ngân V. Ngô
(74) *Attorney, Agent, or Firm*—DeLio & Peterson, LLC; Kelly M. Nowak; Lisa U. Jaklitsch (57) ABSTRACT

Methods of forming and the integrated circuit device structure formed having vertical interfaces adjacent an existing crack stop around a perimeter of a chip, whereby the vertical interface controls cracks generated during side processing of the device such as dicing, and in service from penetrating the crack stop. The vertical interface is comprised of a material that prevents cracks from damaging the crack stop by deflecting cracks away from penetrating the crack stop, or by absorbing the generated crack energies. Alternatively, the vertical interface may be a material that allows advancing cracks to lose enough energy such that they become incapable of penetrating the crack stop. The present vertical interfaces can be implemented in a number of ways such as, vertical spacers of release material, vertical trenches of release material or vertical channels of the release material.

19 Claims, 9 Drawing Sheets

CRACKSTOP WITH RELEASE LAYER FOR CRACK CONTROL IN SEMICONDUCTORS

BACKGROUND OF INVENTION

The present invention relates to semiconductor substrates, and more particularly, to methods and semiconductor structures having a release layer for controlling cracks that form during dicing or as a result of package-induced stresses.

Integrated circuits are fabricated by building multiple layers of wiring and passivation on substrates (wafers) that contain semiconductor devices. Upon completion of substrate-level processing, wafers are diced to provide individual chips. The dicing process often causes cracks that damage active areas of the chips. To prevent such damage, crack stop layers have been employed along the perimeter of the chip.

These crack stop layers often take on additional functions for low-K dielectrics, such as providing an edge seal to prevent moisture ingress that can damage or destroy active areas of a chip. They also protect active areas of chips from cracks, which may emanate from the diced edges as a result of package-induced stresses. However, as the dielectric constant of the material is lowered, the insulator material becomes mechanically weaker, and as such, it becomes significantly easier for the crack stop/edge seal to be breached. To address this problem, prior art has been focused on the use of multiple redundant crack stop/edge seals. However, this type of conventional approach takes up valuable "real estate" on the chip, ultimately reducing the number of chips that can be produced per wafer.

Thus, as retention of real estate on the chip is crucial for productivity, further improved methods and processing layers are needed in the art for controlling edge-cracking in chips. Preferably, these methods and layers would take up minimal space on the chip and allow for the control of cracking during dicing, as well as in service.

SUMMARY OF INVENTION

Bearing in mind the problems and deficiencies of the prior art, it is therefore an object of the present invention to provide methods of forming at least one vertical interface that controls cracks from penetrating into active areas of chips, in particular, cracks generated at chip edges by dicing or by package-induced stresses while the chip is in service.

Another object of the present invention is to provide methods of forming and at least one vertical interface that deflects cracks generated during integrated circuit fabrication, and in particular during dicing, and thereby preventing any cracks from penetrating into a crack stop.

A further object of the invention is to provide methods of forming smaller, faster integrated circuits having at least one vertical interface, such as a vertical release layer, for absorbing cracks generated by dicing or by package-induced stresses while the chip is in service.

It is yet another object of the present invention to provide methods of forming integrated circuits having at least one vertical interface that reduces the real estate required for crack stops by making crack stops more effective, thereby enabling fewer crack stops to be used such that a greater number of chips can be produced per wafer.

It is another object of the present invention to provide strong, reliable and efficient semiconductor chips having at least one vertical interface in close proximity to a crack stop.

Still other objects and advantages of the invention will in part be obvious and will in part be apparent from the specification.

The above and other objects, which will be apparent to those skilled in art, are achieved in the present invention, which is directed to in a first aspect, a method of controlling cracks in a semiconductor device. The method at least includes providing an integrated circuit structure having a crack stop along its perimeter. At least one opening is formed adjacent to the crack stop, and a release material is deposited in an amount sufficient to at least fill the opening. Excess release material is then removed to form a vertical interface within the opening adjacent to the crack stop, which acts to prevent cracks from penetrating into the crack stop.

The release material may be a material having low adhesion strength to adjoining layers enabling such cracks to be deflected away from the crack stop, whereby penetration of the crack into the crack stop is avoided. Alternatively, the release material may be a material having a sufficient toughness to enable the vertical interface to control the cracks in the semiconductor by absorbing the cracks, thereby preventing the cracks from penetrating the crack stop.

In the invention, the vertical interface may be a plurality of individual spacer structures. The plurality of individual spacer structures are provided by etching exposed portions of a non-ultra low-k dielectric in a wiring level to form a plurality of openings, followed by depositing the release material in an amount sufficient to fill cover the sidewalls of the plurality of openings. The release material is then etched to form the vertical interface comprising a plurality of individual spacer structures throughout the semiconductor, whereby selected ones of these vertical interface are adjacent the crack stop for controlling cracks in the semiconductor.

Once the vertical interface is formed, the method may further include depositing a low-k material in an amount sufficient to fill any remaining gaps in the wiring level, and planarizing a surface of the semiconductor to at least expose the vertical interface. A capping layer is then deposited over a surface of the wiring level. These steps may be repeated until a final, desired integrated circuit structure is achieved.

Alternatively, the vertical interface may comprise a release trench along the perimeter of the integrated circuit within the opening adjacent to the crack stop. This release trench is formed by depositing a resist material over a surface of the semiconductor, followed by patterning the resist material to form a patterned resist having a channel opening adjacent to the outside perimeter of the crack stop. The release material is then deposited in the amount sufficient to fill cover the sidewalls of the channel opening. The release material is then etched to form the vertical interface comprising the release trench adjacent to the outside perimeter of the crack stop.

The wafer may then be further processed by removing remaining patterned blockout resist, depositing a low-k material in an amount sufficient to fill any remaining gaps in the semiconductor and then planarizing a surface of the semiconductor to at least expose the vertical interface. A cap layer may then be deposited over the surface of the wafer. These processing steps may be repeated until a final integrated circuit structure has been achieved.

In another aspect, the invention is directed to another method of controlling cracks in an integrated circuit device by providing a wiring level having an ultra low-k dielectric layer and a crack stop within the ultra low-k dielectric layer along the perimeter. The ultra low-k dielectric layer within a vertical channel adjacent the crack stop is located and then modified to form a self-aligned vertical interface. This self-aligned vertical interface controls cracks by preventing the cracks from penetrating into the crack stop. The ultra low-k dielectric layer may be modified by either collapsing such dielectric layer to form a void adjacent the crack stop thereby weaken adhesion of the ultra low-k dielectric layer to the crack stop, or it may be modified by increasing toughness of the ultra low-k dielectric for absorbing any crack energies.

In still another aspect, the invention is directed to a crack stop structure located at the perimeter of an integrated circuit device. This structure includes an integrated circuit having a low-k dielectric layer, a crack stop along the perimeter of the circuitry within the dielectric layer and a vertical interface. The vertical interface resides along the perimeter of the circuitry adjacent to the crack stop, within the dielectric layer, for controlling cracks in the circuitry by preventing the cracks from penetrating into the crack stop. The structure may additionally include a low-k material filling voids in the dielectric layer, and a capping layer covering the low-k material. In accordance with the invention, the vertical interface may be either altered low-k dielectric layer, or a release material having either low adhesion or sufficient toughness properties as discussed in detail below.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 5A–5 illustrates the steps of forming the present vertical interface in an ultra low-k dielectric as altered release layer trenches adjacent to a crack stop of the resultant structure, whereby FIG. 5B illustrates that the release layer has been altered by forming a void that weakens adhesion of the present release trench to the crack stop, while

DETAILED DESCRIPTION

In describing the preferred embodiment of the present invention, reference will be made herein to FIGS. 1A–5C of the drawings in which like numerals refer to like features of the invention.

Crack stops are often incorporated around the perimeter of chips for preventing damage or cracks from reaching the active areas of the chips during dicing. The present invention provides a vertical interface adjacent to an existing crack stop around a perimeter of a chip, such as a metal crack stop having a pyramid design. The vertical interface of the invention controls cracks emanating from diced edges from traversing through, i.e., cracking, the crack stop, as well as controls cracks as a result of packaged-induced stresses in service.

The vertical interface is comprised of a material that prevents generated cracks from damaging the crack stop by deflecting any generated cracks from entering into the crack stop or by absorbing the generated cracks. The vertical interface also may be comprised of a material that allows advancing cracks to lose enough energy such that they become incapable of penetrating the crack stop.

The vertical interface can be implemented in a number of ways such as, for example, vertical spacers of release material, vertical trenches of release material, vertical channels of the release material and the like. These vertical interface structures may be formed with or without block out masks. An essential feature of the present vertical interface (s) is that it comprises a material having a low adhesion interface to the crack stop such that any generated cracks are controlled by being diverted from passing through the crack stop and instead travel along the crack stop, or of a material having internal interfaces that can deflect the crack and absorb its energy. The vertical interface, i.e., release layer, can also be of a material having sufficient toughness to absorb any crack energy.

For a better understanding of the present invention, reference is now made to the drawings wherein the vertical interface of the invention for controlling generated cracks is formed using a release layer.

Figure 1A:
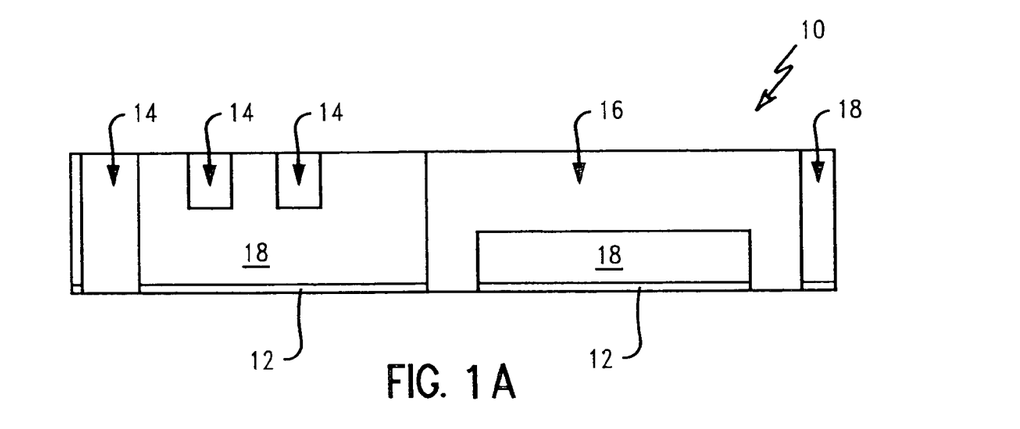
FIGS. 1A–1 show, in sequence, the steps of forming the vertical interface of the invention as a plurality of individual spacer structures throughout the chip.

Referring to FIGS. 1A–1, the vertical interface of the invention may be formed as a plurality of individual spacer structures throughout the chip. In so doing, FIG. 1A illustrates a dual damascene structure 10, such as a damascene structure in a non-ultra low-k dielectric 18 which includes crack stop 16 surrounding a perimeter of the chip and interconnecting wirings 14, such as copper wirings, in an original dielectric layer 18 over cap layer 12. The dielectric layer 18 is preferably a non-ultra low-k dielectric such as $SiO_2$, SiLK® from Dow Chemical Corporation, SiCOH and the like.

Figure 1B:
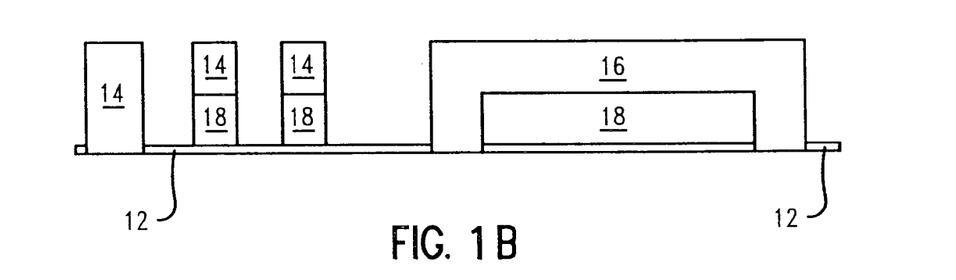

A top surface of the structure is then etched back such that exposed regions of dielectric layer 18 are removed between the interconnecting wirings 14 and crack stop 16 to form the structure of FIG. 1B. This may be accomplished by reactive ion etching using a chemistry suitable to remove the dielectric layer 18, such as, a fluorocarbon based etchant for a $SiO_2$ layer 18, e.g., $CF_4$, $C_2F_6$, and the like; or an oxygen, hydrogen or ammonia based etchant for an organic layer 18.

Figure 1C:
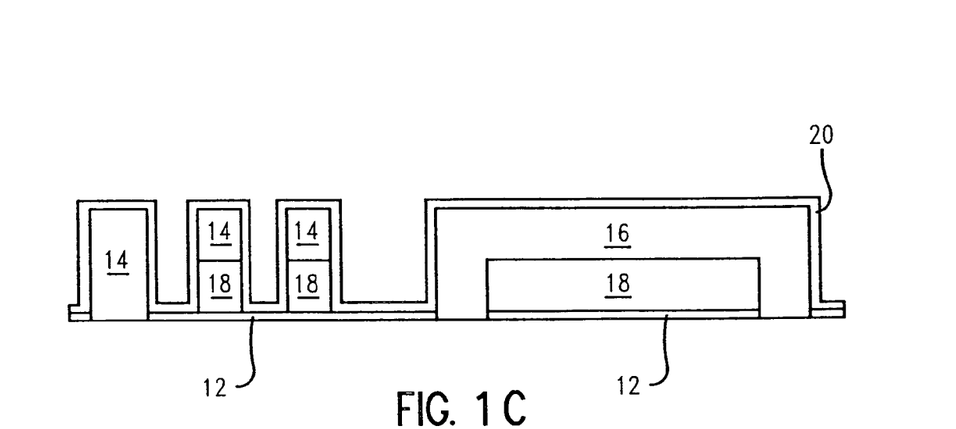

Once etching is complete, the vertical interface of the invention is formed by depositing a release layer 20 over all exposed surfaces of the semiconductor structure. The release layer 20 is preferably conformally deposited to a thickness ranging from about 5 nm to about 50 nm. Again, an essential feature of the present vertical interface(s) is that it comprises a material having a low adhesion interface to the crack stop for deflecting any possible cracks that may otherwise occur through the crack stop, and/or a material of sufficient toughness to absorb any crack energy. In accomplishing this, the release layer 20 may comprise a material that has at least one, or more, of the following properties: low adhesive strength to sidewalls created by the previous etchback process; low adhesive strength to a subsequently deposited layer; an interface internal to a multilayer release layer stack having low adhesive strength and/or sufficient toughness to absorb crack energy.

The present release layer may comprise a material having low adhesion interface for deflecting cracks and/or sufficient toughness including, but not limited to, a polymer, polyimide, a low-k material, such as SiLK® or methyl-silsesquioxane (MSQ), parylene, a low modulus and/or high tensile SiCOH provided that adhesion to the crack stop is poor, and the like. For instance, the release layer may be a material having poor adhesion to sidewalls, such as, a fluorine-containing etch polymer, SiLK® or any other organic without adhesion promoter. Alternatively, the release layer may be a material having poor adhesion to a subsequently deposited layer such as TEFLON® from Dupont Corporation, or even further, the release layer may be a material having a weak internal interface such as SiCN+SiCOH. Still further, release layer 20 may comprise a material having sufficient toughness to absorb any generated crack energies, such as, thermoplastic polymers.

Figure 1D:
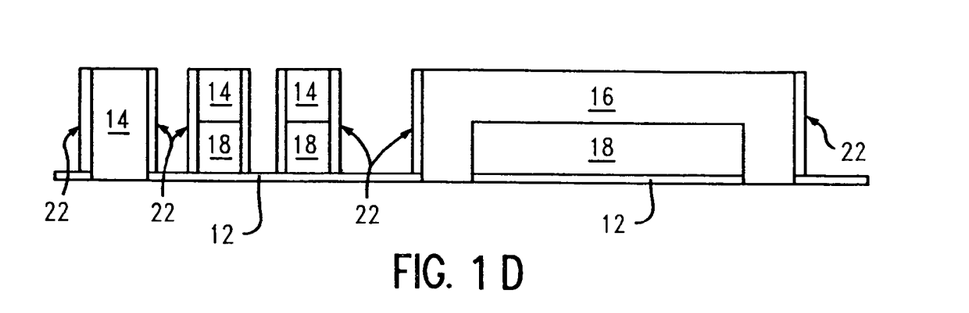

Referring to FIG. 1D, a top surface of the semiconductor structure is then etched back to remove portions of the release layer 20 at the surface of the structure. In so doing, etching stops once a top surface of the interconnecting wires 14 and the crack stop 16 has been reached such that a plurality of individual spacer release structures 22 are present over the entire chip.

Figure 1E:
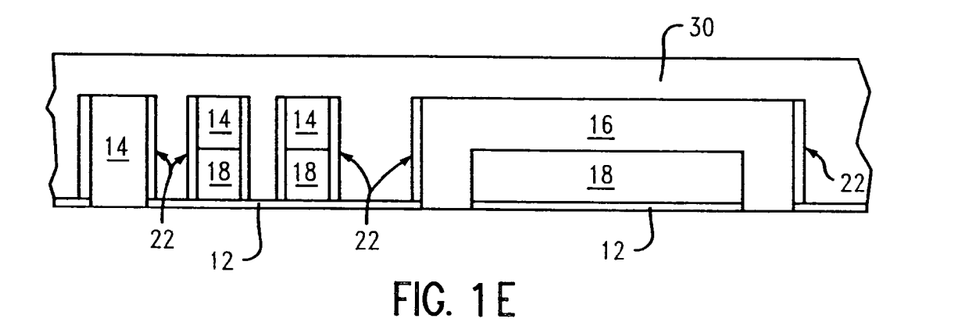

In continuing processing of the semiconductor structure, referring to FIG. 1E, a low-k material 30, preferably an ultra low-k material, is deposited over the structure in an amount sufficient to at least fill all gaps in the semiconductor structure. This low-k material may include, but is not limited to Nanoglass, porous SiCOH, porous SiLK®, and the like.

Once the low-k material 30 has been deposited, the surface of the structure is planarized to remove any excess low-k material 30. This may be accomplished by known etch back or CMP techniques. The resultant structure is shown in FIG. 1F having, at a surface thereof, exposed portions of interconnect wirings 14, spacer release structures 22 and crack stop 16.

Figure 1F:
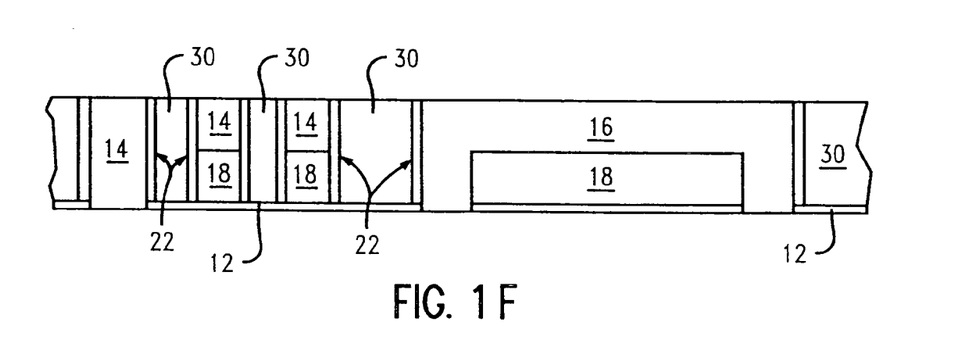
Figure 1G:
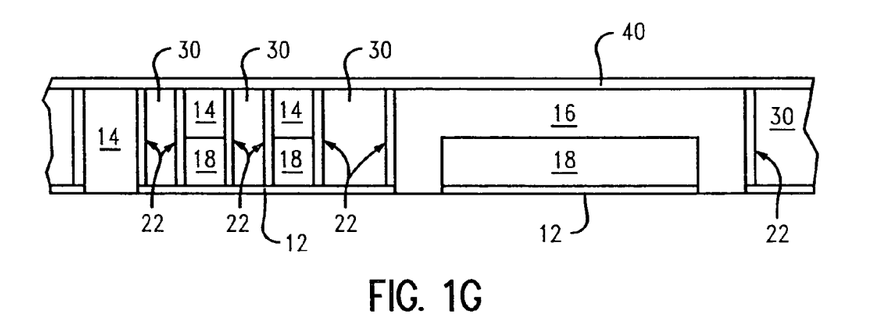

Referring to FIG. 1G, a second cap layer 40, such as PECVD SiCN or SiN, is then deposited over the exposed surfaces of the structure shown in FIG. 1F. For example, a passivation film may be deposited over the final layer containing the present vertical interface, i.e., the vertical interface of the invention resides entirely under a passivation layer of the semiconductor.

In accordance with the invention, as discussed above and further below, the vertical interfaces, i.e., resultant release structures, are located along the perimeter of the chip adjacent the crack stop, such that these release structures 22 face the dicing channels of the chip. During dicing, the material of the release structures 22 is loosely adhered to the walls of the crack stop such that it deflects any cracks from passing through the crack stop and instead diverts such cracks to travel along the crack stop, or is of a material having sufficient toughness, as discussed above, to absorb any cracks.

In accordance with the invention, the above processing steps, as shown with reference to FIGS. 1A–1, may be repeated at least once, or a number of times, as may be required for the particular semiconductor structure being fabricated.

As an alternative to forming vertical interface spacer-like structures from release layer 20 as described above, the vertical interface may be formed as trench-like structures from the release layer 20 that are only present in release layer channels adjacent to the crack stop structure.

Figure 2A:
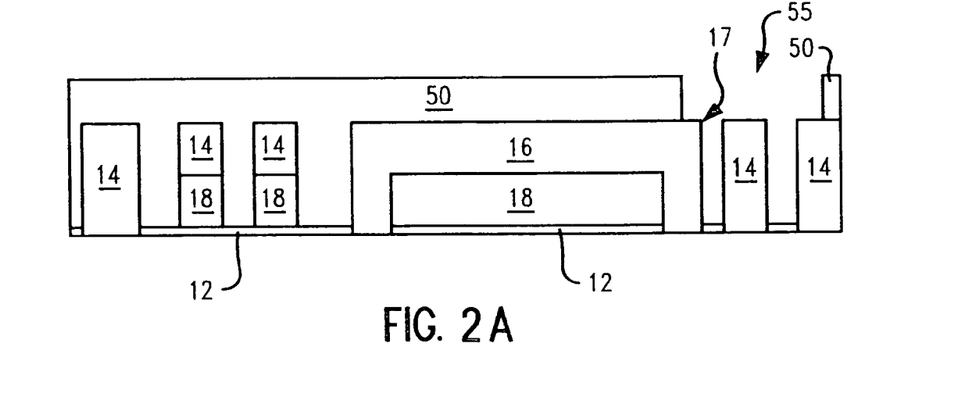
FIGS. 2A–2 show, in sequence, the steps of forming the present vertical interface in a non-ultra low-k dielectric as release layer trenches adjacent to a crack stop of the resultant structure.

In more detail, referring to FIGS. 2A–2, a dual damascene structure is provided, as described above in reference to FIGS. 1A–B, having crack stop 16 along the perimeter of the chip and interconnecting wirings 14 in a dielectric layer 18 over a cap layer 12. However, prior to depositing release layer 20, a blockout resist layer is deposited over the structure and then exposed and developed by lithography to form a patterned blockout resist layer 50 having a release layer channel 55 on an outside perimeter 17 of crack stop 16, as is shown in FIG. 2A.

Figure 2B:
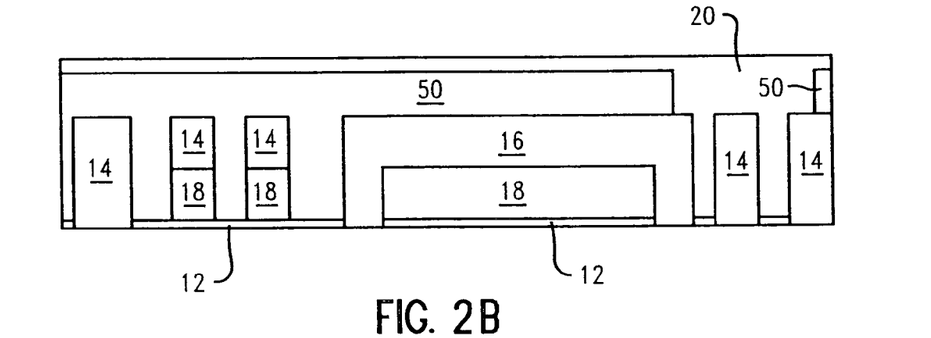

The release layer 20 of the invention is then deposited over the structure shown in FIG. 2A in an amount sufficient to at least fill the release layer channel 55 on the outside perimeter 17 of crack stop 16 such that the vertical interface is formed along the perimeter of the chip adjacent the crack stop. In filling the release layer channel 55, release layer 20 is preferably deposited to a thickness ranging from about 50 nm to about 1000 nm. Again, an essential feature of the resultant vertical interface of the invention is that it be made of a release layer material that has a low adhesion interface for deflecting any possible cracks that may otherwise occur in the crack stop, and/or a material of sufficient toughness to absorb any generated crack energies. As such, the release layer may comprise any of the materials as discussed in detail above.

Figure 2C:
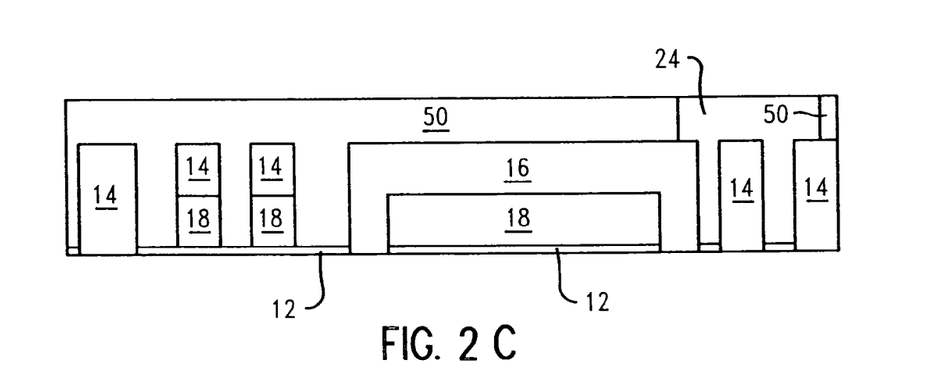

Referring to FIG. 2C, a top surface of the semiconductor structure is then etched back to remove portions of the release layer 20 at the surface of the structure. Etching stops once a top surface of the patterned blockout resist layer 50 has been reached such that the release layer 20 only remains in release layer channels 55 to fabricate the vertical interface of the invention as a release trench 24 adjacent to crack stop 16.

Figure 2D:
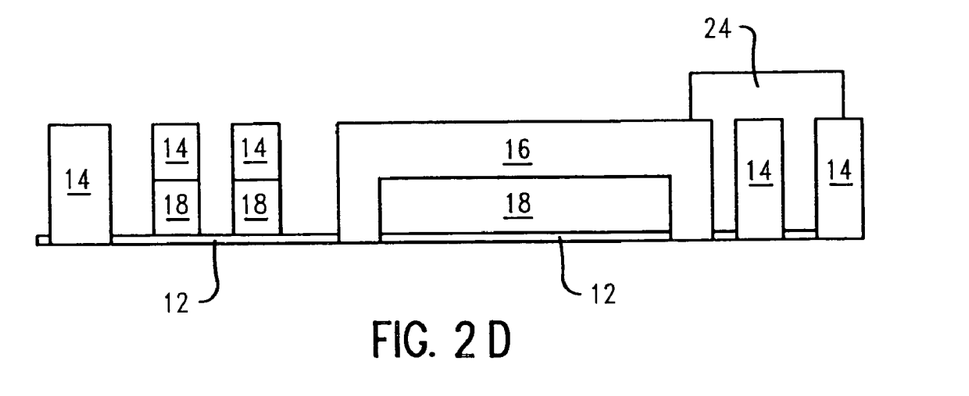
Figure 2E:
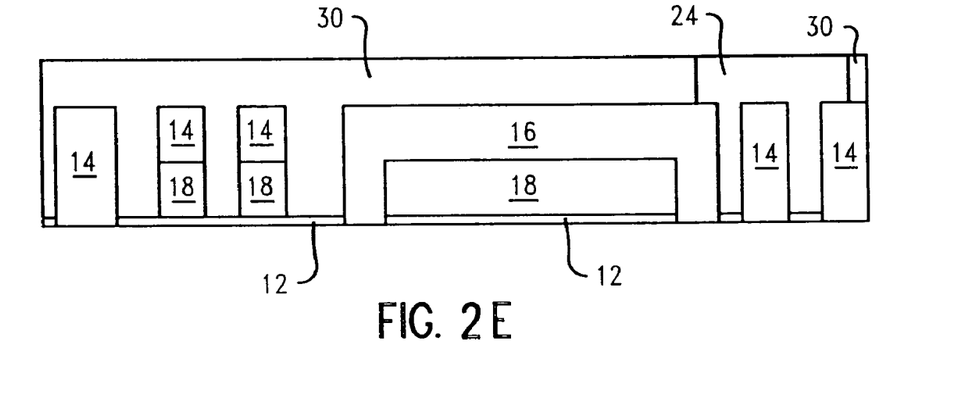
Figure 2F:
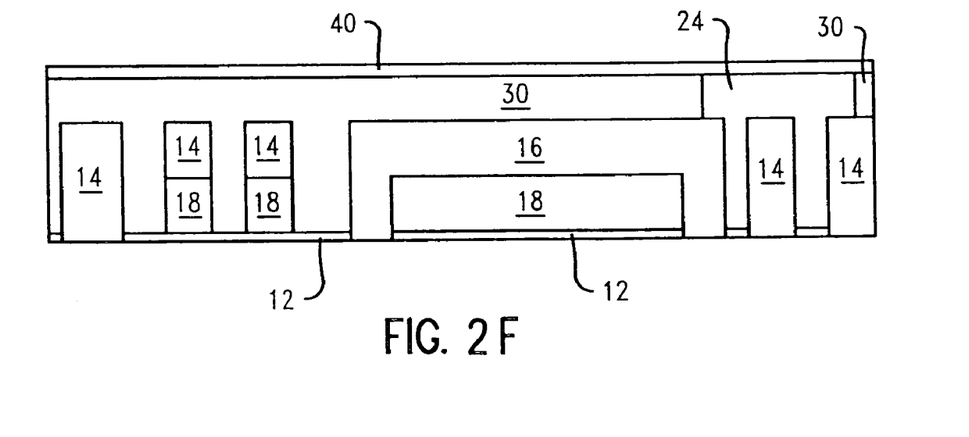

The patterned blockout resist layer 50 is then removed, such as by stripping, as shown in FIG. 2D. The low-k material 30, preferably ultra low-k material, is then deposited over the semiconductor structure, and the surface planarized to remove any excess low-k material 30 thereby resulting in the structure as shown in FIG. 2E. Referring to FIG. 2F, cap layer 40 is then deposited over the structure to allow for further processing.

Again, the above processing steps, as shown with reference to FIGS. 2A–2, may be repeated at least once, or a number of times, as may be required for the particular semiconductor structure being fabricated.

Figure 3A:
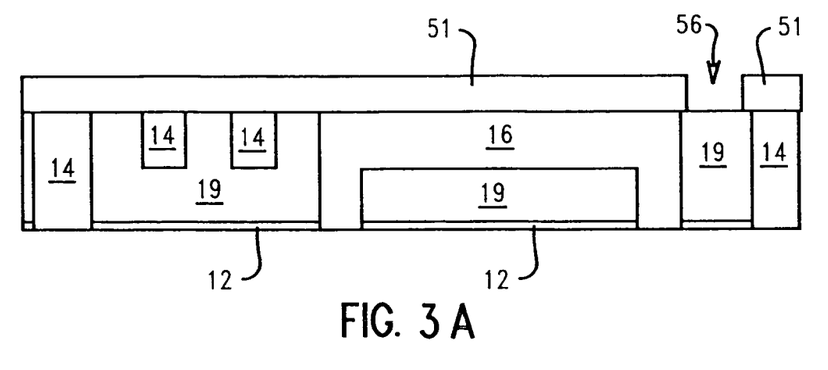
FIGS. 3A–3 show, in sequence, the steps of forming the present vertical interface in an ultra low-k dielectric as release layer trenches adjacent to a crack stop of the resultant structure.

FIGS. 3A–3 illustrate an alternate approach to forming release layer channels adjacent to the crack stop 16. FIG. 3A illustrates a dual damascene structure, such as a damascene structure in an ultra low-k dielectric, having crack stop 16 surrounding chip perimeter and interconnecting wirings 14, such as copper wirings, in dielectric layer 19 over cap layer 12. In this structure, dielectric layer 19 is preferably an ultra low-k dielectric such as porous SiCOH, nanoglass and the like.

Figure 3B:
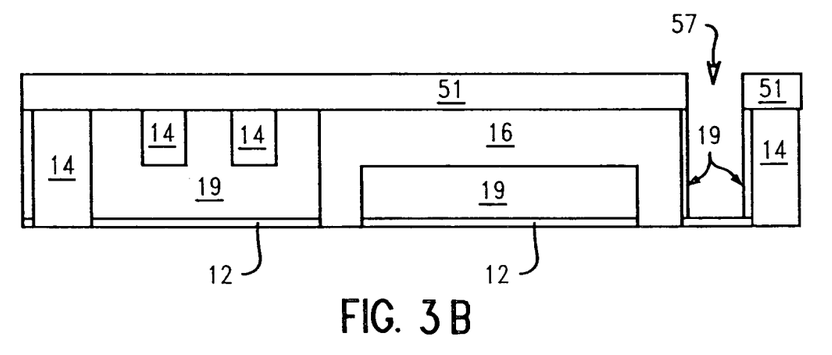

Referring to FIG. 3A, a blockout resist layer is deposited over the structure and then exposed and developed by lithography to form a patterned blockout resist layer 51 having opening 56 exposing a portion of dielectric layer 19 adjacent the crack stop 16. Using the patterned blockout resist layer 51, the exposed portion of dielectric layer 19 is then removed, such as by etching, to form release layer channel 57 substantially adjacent crack stop 16. As is shown in FIG. 3B, a thin layer of dielectric layer 19 remains on the sidewalls of the release channel, and a portion of cap layer 12 resides at a bottom of the release channel 57. This release channel is preferably narrow enough so that a subsequent step of filling the channel with release layer causes a pinch-off of the release layer fill material.

Figure 3C:
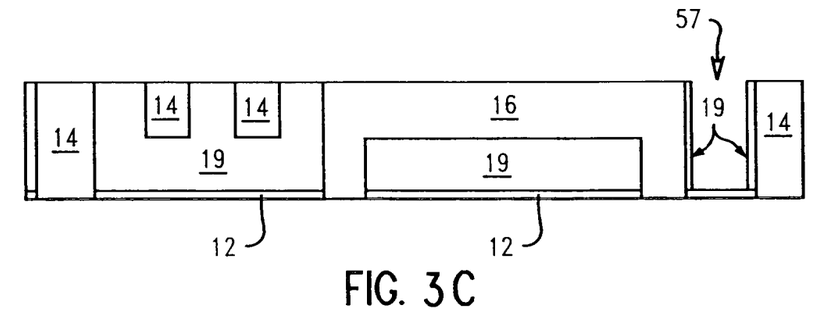
Figure 3D:
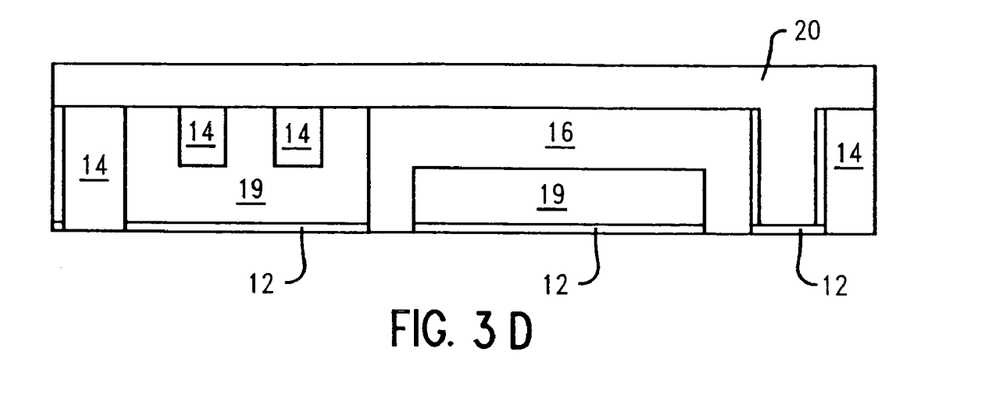

Referring to FIGS. 3C–D, once the release channel 57 is formed, the patterned blockout resist layer 51 is removed, such as by stripping, and then the release layer 20 of the invention is deposited over the structure in an amount at least sufficient to fill the release layer channel 57. In so doing, the release layer 20 is preferably deposited to a thickness ranging from about 50 nm to about 1000 nm. As discussed above, an essential feature of release layer 20 is that it comprises a material having a low adhesion interface for deflecting any possible cracks that may otherwise occur, and/or a material of sufficient toughness to absorb any generated crack energies. The release layer may comprise any of the materials discussed above.

Figure 3E:
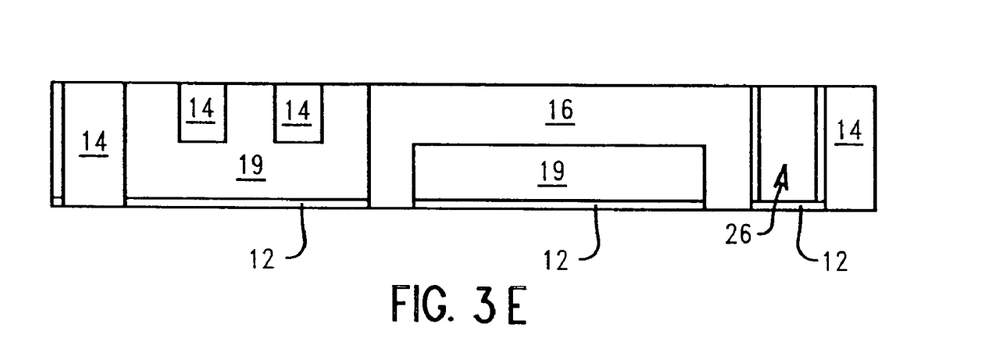
Figure 3F:
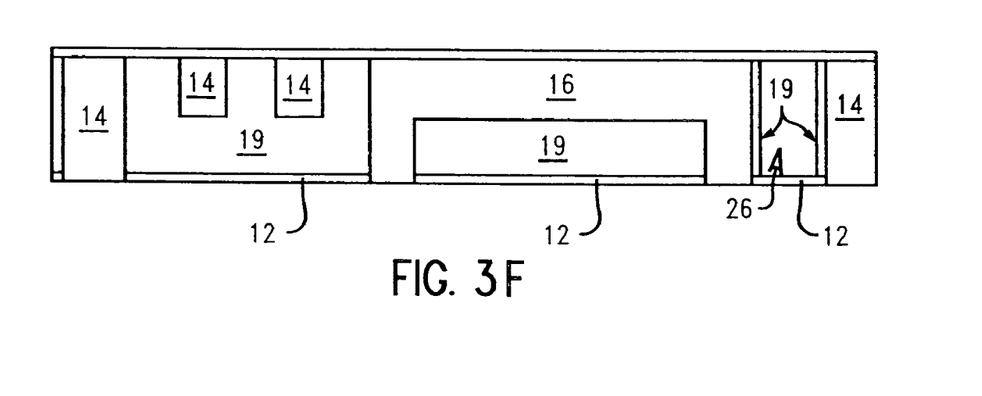

Referring to FIGS. 3E–F, the surface of the semiconductor structure is then planarized such that excess release layer 20 is removed in order to form release trench 26 that is substantially adjacent crack stop 16, therein being separated from crack stop 16 by dielectric coating 19 on sidewalls of the release trench. Cap layer 40 is then deposited over the structure surface and planarized to provide the semiconductor structure with a substantially planar surface for further processing.

The above processing steps, as shown with reference to FIGS. 3A–F, may be repeated at least once, or a number of times, as may be required for the particular semiconductor structure being fabricated.

Figure 4A:
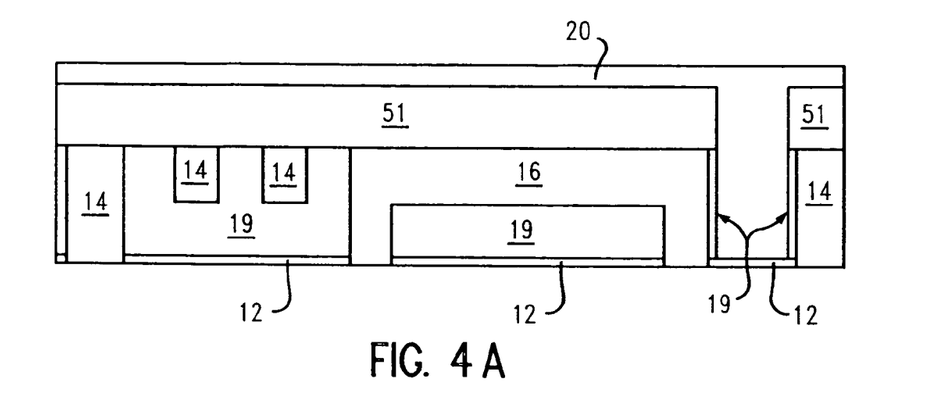
FIG. 4A shows alternate processing steps to those of FIGS. 3B–3 whereby any excess release layer used to form the present vertical interface and the patterned blockout resist layer are either sequentially or simultaneously removed to form the structure of FIG. 3E.
Figure 4B:
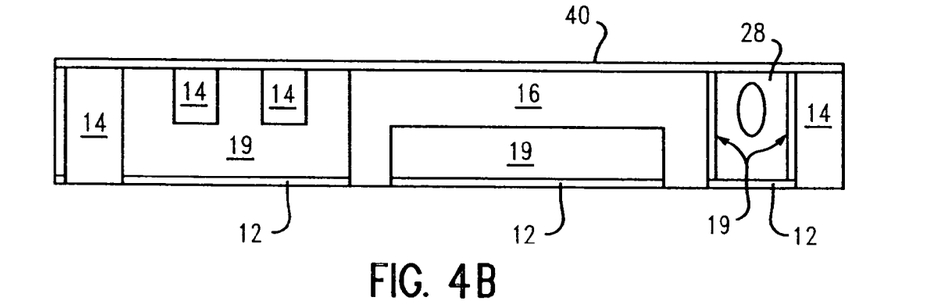
FIG. 4B illustrates that the vertical interface of FIG. 3F may be formed as a voided release layer channel.
Figure 4C:
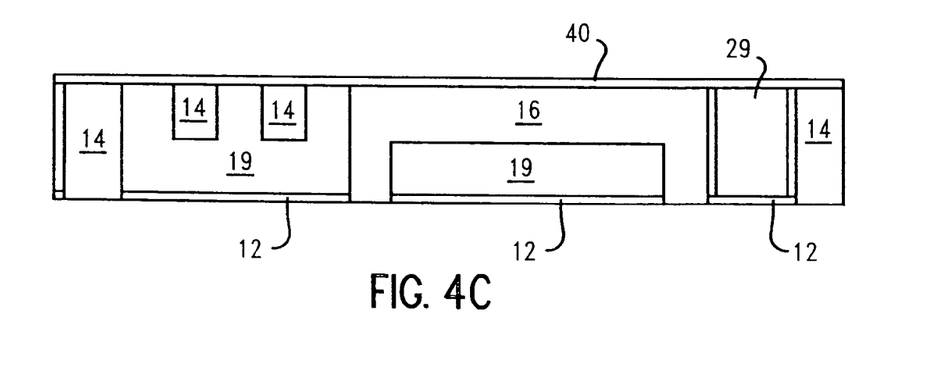
FIG. 4C illustrates that the vertical interface of FIG. 3F is formed directly adjacent the crack stop to either deflect or absorb any generated cracks during semiconductor processing.

FIGS. 4A–C refer to variant processing steps with reference to those discussed in relation to FIGS. 3A–F. Referring to FIG. 4A, as an alternate to the processing steps as shown in FIGS. 3B–3, the patterned blockout resist layer 51 may be formed, the release layer 20 deposited over the patterned blockout resist layer 51 in an amount to fill the release layer channel 57, and then any excess release layer followed by the patterned blockout resist layer 51 removed to ultimately result in structure as shown in FIG. 3E. Alternatively, the excess release layer and the blockout resist layer 51 are removed simultaneously to result in the drawing of FIG. 3E. Processing then continues as discussed above.

Alternate resultant semiconductor structures are shown in FIGS. 4B–C. FIG. 4B, is similar to that of FIG. 3F, however, the release layer channel is formed as a voided release layer channel 28 by depositing layer 20 using an unconformal process such as PECVD. Referring to FIG. 4C, the processing steps of FIGS. 3A–3 is modified such that in the formation of the release channel 57, all dielectric layer 19 is removed therein. As such, the channel is directly adjacent the crack stop 16. In so doing, upon forming the release layer channel of the invention in accordance with the processed described in relation to FIGS. 3A–3, the resultant release layer channel is a release layer channel 29 that is directly adjacent crack stop 16, therein residing between crack stop 16 and at least one interconnecting wire 14.

Figure 5A:
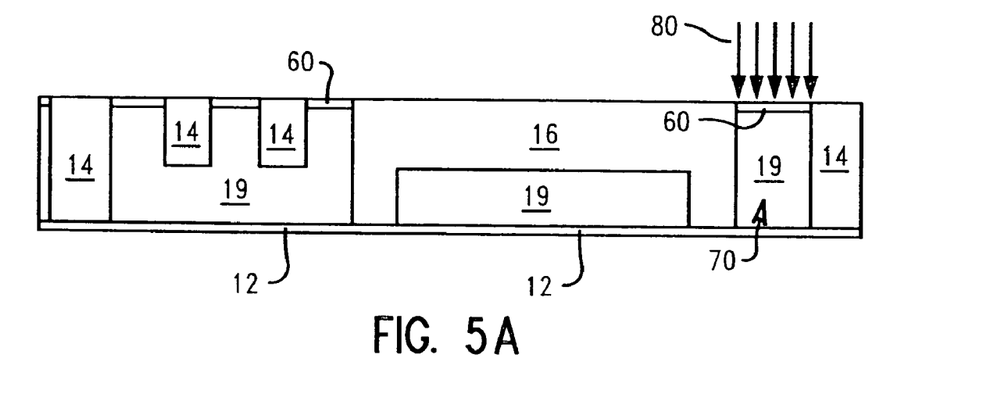

Referring to FIG. 5A, a dual damascene structure, such as a damascene structure in an ultra low-k dielectric, is provided having crack stop 16 surrounding chip and interconnecting wirings 14, such as copper wirings, in dielectric layer 19 over cap layer 12. In this structure, dielectric layer 19 is preferably an ultra low-k dielectric such as porous SiCOH, and the like. A hard mask layer 60 may be provided over exposed surfaces of the ultra low-k dielectric layer 19. The hard mask layer 60 may comprise a material such as SiC, SiN, OSG and the like.

The ultra low-k dielectric material residing within the release layer channel 70 that is directly adjacent crack stop 16 is then modified to induce toughness and/or weaken adhesion to the crack stop. This may be accomplished by exposing the ultra low-k dielectric material within release channel 70 to radiation 80 that is capable of altering the physical and/or mechanical properties of the release material within the channel 70 adjacent crack stop 16.

This step of exposing the dielectric material having poor crack stop resistance may be accomplished using radiation sources such as e-beam, ultraviolet light, visible light, or laser light for altering the properties of the release material as discussed above. Preferably, a laser having a wavelength that is absorbed by the low k dielectric material, such as a wavelength ranging from about 1 to 5 microns, is emitted through the hard mask 60, along the chip edge, and into channel 70 of dielectric material to locally change such dielectric material adjacent to the crack stop 16. As a result, this altered dielectric material within the channel is transformed into the present vertical interface is the form of a release material trench, whereby this vertical interface is self-aligned as formed. Alternatively, the wafer could be masked using a shadow mask or patterned photoresist to limit radiation 80 to channel 70 (not shown).

Figure 5B:
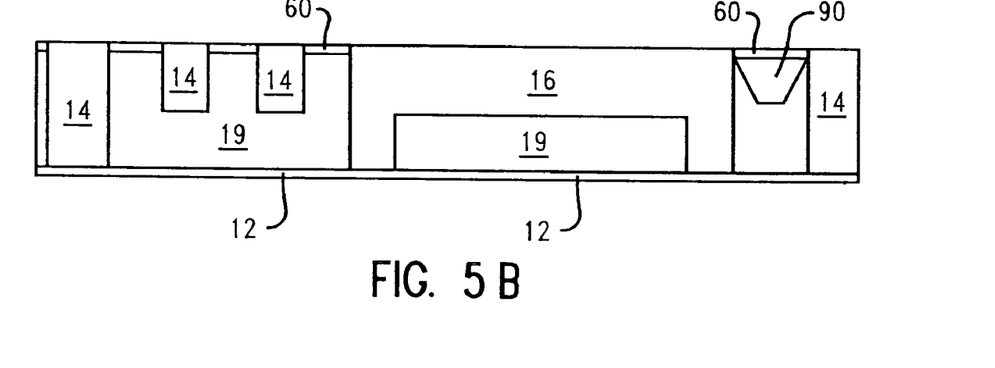
Figure 5C:
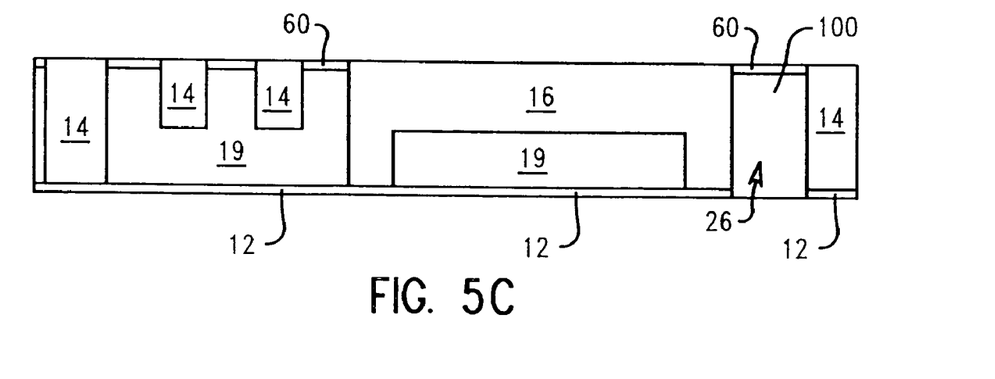
FIG. 5C illustrates that the release layer has been altered by changing the dielectric mechanical properties of the release layer to increase its crack resistance adjacent the crack stop, i.e., increase its toughness.

Many porous low k dielectrics, such as porous SiLK®, have high absorption coefficients at IR or optical wavelengths. By radiating or heating these materials in accordance with the invention, the high absorption coefficients cause local collapsing or changing of the porous low k dielectric to either result in a void 90 adjacent the perimeter of the crack stop that weakens the adhesion of the present release trench to the crack stop such that this void 90 acts as a crack stop, as is shown in FIG. 5B. This radiation may also induce a volume shrinkage within material 19 such that it pulls away from the sidewalls and produces sidewall voids (not shown). Alternatively, radiating or heating the dielectric material may physically change the dielectric mechanical properties to result in vertical interface in the form of an altered release trench 100 having increased crack resistance adjacent the crack stop, i.e., increased toughness, as shown in FIG. 5C. In accordance with the invention, it should be appreciated that this aspect of irradiating or heating release material in the release channel adjacent the crack stop is applicable to any dielectric material having poor crack stop resistance which can be changed by irradiation.

The structure of FIGS. 5B–C may then be further processed in accordance with the invention by capping the structure. These steps as referenced to FIGS. 5A–5 may then be repeated any number of times as is required for the particular integrated circuit structure being fabricated.

In accordance with the invention, incorporating a hard mask into those processes making use of ultra-low-K dielectric materials may modify the above steps. In so doing, this hard mask protects the ultra-low-K dielectric materials during processing. Further, hard masks may be integrated into the above process steps for depositing the release layer material only into desired, select areas as may be required by the specific design structure. Another modification of the above approaches is to allow the release trenches be bounded on each side by a metal line/via structure for allowing the dielectric material to be completely etched away without a potential problem of undercutting. Still another modification of the above processes is to allow the patterned block out resist, where used, to remain in place, deposit the release layer material and then simultaneously remove both the release layer and the patterned block out resist, such as by etching back. Still other modifications will be apparent to those of skill in the art.

Accordingly, the present invention provides at least one vertical interface, either in close proximity to a crack stop or in direct contact with a crack stop, whereby this vertical interface(s) controls cracks emanating from diced areas, during dicing as well as in service, by deflecting or absorbing such cracks. Advantageously, the present vertical interface requires minimal surface space on the semiconductor individual chips such that it preserves and maintains the valuable real estate on the semiconductor wafers for increased productivity.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method of controlling cracks in an integrated circuit device comprising:
    providing an integrated circuit having a crack stop along a perimeter of said integrated circuit;
    forming at least one opening in a wiring level in said integrated circuit adjacent to said crack stop;
    depositing a release material over said integrated circuit in an amount sufficient to at least fill said opening;
    removing excess release material to form a vertical interface along said perimeter of said integrated circuit within said opening adjacent said crack stop, thereby controlling cracks in said integrated circuit via said vertical interface and preventing said cracks from penetrating into said crack stop.

2. The method of claim 1 wherein said release material comprises a material having low adhesion strength to adjoining sidewalls to enable said vertical interface to control said cracks in said integrated circuit by deflecting said cracks away from said crack stop such that penetration of said crack into said crack stop is avoided.

3. The method of claim 2 wherein said material is selected from the group consisting of a polymer, fluoropolymer, polyimide, a low-k material, SiLK®, methylsilsesquioxane, an organic without adhesion promoter, parylene, a field oxide, SiCOH, an organic without adhesion promoter, TEFLON®, and SiCN+SiCOH.

4. The method of claim 1 wherein said release material comprises a material having a sufficient toughness to enable said vertical interface to control said cracks in said integrated circuit by absorbing said cracks, thereby avoiding said cracks from penetrating said crack stop.

5. The method of claim 4 wherein said release material comprises a thermoplastic polymer.

6. The method of claim 1 wherein said vertical interface comprises a plurality of individual spacer structures throughout said integrated circuit.

7. The method of claim 6 wherein said integrated circuit further includes a non-ultra low-k dielectric such that said crack stop and a plurality interconnecting wirings reside within said non-ultra low-k dielectric, the method further comprising:
    etching exposed portions of said non-ultra low-k dielectric of said integrated circuit to form a plurality of openings;
    depositing said release material in an amount sufficient to fill said plurality of openings; and
    etching said release material to form vertical interface comprising said plurality of individual spacer structures throughout said integrated circuit, whereby selected ones of said vertical interface are adjacent said crack stop for controlling cracks in said integrated circuit.

8. The method of claim 7 further comprising the steps of:
    depositing a low-k material in an amount sufficient to fill any remaining gaps in said integrated circuit;
    planarizing a surface of said integrated circuit to at least expose said vertical interface;
    depositing a capping layer over a surface of said integrated circuit; and
    repeating said steps until a final integrated circuit structure is achieved.

9. The method of claim 1 wherein said vertical interface comprises a release trench along said perimeter of said integrated circuit within said opening adjacent said crack stop.

10. The method of claim 9 wherein said integrated circuit further includes an ultra low-k dielectric such that said crack stop and a plurality interconnecting wirings reside within said ultra low-k dielectric, the method further comprising:
    depositing a resist material over a surface of said integrated circuit;
    patterning said resist material to form a patterned resist having a channel opening adjacent to an outside perimeter of said crack stop;
    depositing said release material in said amount sufficient to fill said channel opening; and
    etching said release material to form said vertical interface comprising said release trench along said integrated circuit perimeter adjacent to said outside perimeter of said crack stop, said release trench for controlling cracks in said integrated circuit.

11. The method of claim 10 further comprising the steps of:
    removing remaining patterned blockout resist;
    depositing a low-k material in an amount sufficient to fill any remaining gaps in said integrated circuit;
    planarizing a surface of said integrated circuit to at least expose said vertical interface;
    depositing a capping layer over a surface of said integrated circuit; and
    repeating said steps until a final integrated circuit structure is achieved.

12. The method of claim 9 wherein said release trench along said perimeter of said integrated circuit within said opening adjacent said crack stop further includes a void in said release trench.

13. The method of claim 1 wherein said release layer is deposited to a thickness ranging from about 5 nm to about 1000 nm.

14. A method of controlling cracks in a integrated circuit device comprising:
    providing an integrated circuit having an ultra low-k dielectric layer;

providing a crack stop within said ultra low-k dielectric layer along a perimeter of said integrated circuit;

locating said ultra low-k dielectric layer within a vertical channel adjacent said crack stop;

modifying said ultra low-k dielectric layer within said vertical channel adjacent said crack stop to form a self-aligned vertical interface; and controlling cracks in said integrated circuit by said self-aligned vertical interface preventing said cracks from penetrating into said crack stop.

15. The method of claim 14 further including depositing a hard mask over said ultra low-k dielectric layer and patterning said hard mask to form an opening adjacent said crack stop such that said ultra low-k dielectric layer within said opening is exposed for modifying.

16. The method of claim 14 wherein said ultra low-k dielectric layer within said vertical channel adjacent said crack stop is modified by exposing said ultra low-k dielectric layer to radiation for locally alter physical properties of said ultra low-k dielectric layer.

17. The method of claim 16 wherein said physical properties of said ultra low-k dielectric layer are altered by collapsing said ultra low-k dielectric layer within said vertical channel to form a void in said vertical channel adjacent said perimeter of said crack stop to weaken adhesion of said ultra low-k dielectric layer to said crack stop to enable said self-aligned vertical interface to control said cracks in said integrated circuit by deflecting said cracks away from said crack stop such that penetration of said crack into said crack stop is avoided.

18. The method of claim 16 wherein said physical properties of said ultra low-k dielectric layer are altered by increasing toughness of said ultra low-k dielectric layer within said vertical channel to enable said self-aligned vertical interface to control said cracks in said integrated circuit by absorbing said cracks, thereby avoiding said cracks from penetrating said crack stop.

19. The method of claim 14 further including the step of repeating said steps until a final integrated circuit structure is achieved.

* * * * *